United States Patent
Imanaka et al.

(10) Patent No.: US 9,293,740 B2
(45) Date of Patent: Mar. 22, 2016

(54) METHOD OF MANUFACTURING EL DISPLAY DEVICE

(71) Applicant: PANASONIC CORPORATION, Osaka (JP)

(72) Inventors: Seiji Imanaka, Hyogo (JP); Kazuo Uetani, Hyogo (JP); Zenken Kin, Hyogo (JP)

(73) Assignee: JOLED INC, Tokyo (JP)

( * ) Notice: Subject to any disclaimer, the term of this patent is extended or adjusted under 35 U.S.C. 154(b) by 0 days.

(21) Appl. No.: 14/584,997

(22) Filed: Dec. 29, 2014

(65) Prior Publication Data

US 2015/0118768 A1   Apr. 30, 2015

Related U.S. Application Data

(63) Continuation of application No. PCT/JP2014/002158, filed on Apr. 16, 2014.

(30) Foreign Application Priority Data

Apr. 22, 2013  (JP) ................. 2013-089022

(51) Int. Cl.
| | |
|---|---|
| H01L 51/00 | (2006.01) |
| H01L 33/00 | (2010.01) |
| H01L 51/56 | (2006.01) |
| H01L 51/52 | (2006.01) |
| C23C 16/04 | (2006.01) |
| H01L 27/32 | (2006.01) |

(52) U.S. Cl.
CPC .............. *H01L 51/56* (2013.01); *C23C 16/042* (2013.01); *H01L 51/524* (2013.01); *H01L 51/5246* (2013.01); *H01L 51/5253* (2013.01); *H01L 27/3244* (2013.01); *H01L 2227/323* (2013.01)

(58) Field of Classification Search
CPC . H01L 51/56; H01L 51/5246; H01L 51/5253; H01L 51/524; H01L 2227/323; H01L 2227/3244; C23C 16/042
See application file for complete search history.

(56) References Cited

U.S. PATENT DOCUMENTS

| | | | |
|---|---|---|---|
| 2011/0291116 A1 | 12/2011 | Kang et al. | |
| 2013/0203193 A1 | 8/2013 | Kang et al. | |
| 2014/0311668 A1* | 10/2014 | Yanagi | ................ H01L 51/5246 156/273.7 |

FOREIGN PATENT DOCUMENTS

| | | | |
|---|---|---|---|
| JP | 2007-005189 A | 1/2007 |
| JP | 2007-273274 A | 10/2007 |
| JP | 2011-076759 A | 4/2011 |
| JP | 2011-249089 A | 12/2011 |
| JP | 2011-249301 A | 12/2011 |

OTHER PUBLICATIONS

International Search Report issued in International Publication Application No. PCT/JP2014/002158 dated Jun. 10, 2014, with English Translation.

* cited by examiner

*Primary Examiner* — Victor A Mandala
*Assistant Examiner* — Quovaunda V Jefferson
(74) *Attorney, Agent, or Firm* — McDermott Will & Emery LLP

(57) ABSTRACT

A method of manufacturing an EL display device having a panel part that comprises a light emitting part in which a plurality of pixels are arrayed, and a thin-film transistor array device to control light emission of the light emitting part. The method includes the following steps: forming the panel part on a substrate, and then forming a sealing layer to cover the panel part. The step of forming the sealing layer is performed by forming a film configuring the sealing layer, with the mask being disposed over base substrate. Mask includes contact part in contact with the base substrate, and edge part disposed over the panel part with a gap between the edge part and the panel part.

2 Claims, 4 Drawing Sheets

METHOD OF MANUFACTURING EL DISPLAY DEVICE

RELATED APPLICATIONS

This application is a Continuation of International Application No. PCT/JP2014/002158, filed on Apr. 16, 2014, which in turn claims the benefit of Japanese Application No. 2013-089022, filed on Apr. 22, 2013 the disclosures of which Applications are incorporated by reference herein.

BACKGROUND

1. Field

The present technology disclosed herein relates to methods of manufacturing EL display devices.

2. Description of the Related Art

In recent years, next-generation display devices have been actively developed. Among others, an EL (Electroluminescence) display device receives much attention which has a driving substrate on which first electrodes, a plurality of organic layers including light emitting layers, and second electrodes are laminated in this order. The EL display device features a wide viewing angle because of being self-luminous, power saving expectable due to no need for a backlight, high responsiveness, a thin depth of the device, and the like. For this reason, introduction of the EL display device has been strongly desired into applications for large screen display devices such as television receivers.

In applications of color display, a display technology using three-color pixels, i.e. red, blue, and green colors, is most commonly employed. Besides it, aiming at improving power saving, reliability, etc., developments of other display technologies have been advanced at various manufactures, by using four-color pixels, i.e. red, blue, green, and white colors, or alternatively red, blue, green, and light-blue colors or the like.

In an organic EL light-emitting element, it is required to form, for every pixel, an organic EL light-emitting part for each of three colors of red, blue, and green, or alternatively for each of four colors of such as red, blue, green, and white.

The most common process for forming discrete organic EL parts is such that a fine-metal mask having fine holes is used to form the organic EL parts only at locations corresponding to the holes, by vapor deposition through the mask. For example, a red-color fine-metal mask is used to form the organic EL parts to emit red light by vapor deposition through it; a green-color fine-metal mask is used to form the organic EL parts to emit green light by vapor deposition through it a blue-color fine-metal mask is used to form the organic EL parts to emit blue light by vapor deposition through it. This completes the light emitting parts to emit respective red, green, and blue light.

On the other hand, it is important to develop technology of organic EL light-emitting element which allows the use of a large size substrate, aiming at manufacturing large-size organic EL light-emitting elements and at reducing costs.

Recently, much attention has been paid to the following two methods of forming organic EL light-emitting elements through the use of a large size substrate.

One is such that white-color organic EL elements are formed over the entire region of display, and color display is performed by using a four-color filter for red, green, blue, and white colors. This method is effective in forming a large screen, a high definition display, and the like.

The other, an attention-getting method of forming organic EL light-emitting elements on a large size substrate, is such that organic EL light-emitting parts are formed by a coating method. As the coating method, various processes have been examined which can be divided broadly into two categories: That is, one includes relief printing, flexographic printing, screen printing, and gravure printing, and the other includes inkjet printing (see, Japanese Patent Unexamined Publication No. 2011-249089).

SUMMARY

The present technology disclosed herein is intended to provide a method of manufacturing an EL display device having a panel part. The panel part comprises a light emitting part, in which a plurality of pixels are arrayed, and a thin-film transistor array device to control light emission of the light emitting part. In the method, the panel part is formed on a substrate, followed by forming a sealing layer to cover the panel part. The step of forming the sealing layer is performed by forming a film configuring the sealing layer, with a mask being disposed over the substrate. The mask includes a contact part in contact with the substrate, and an edge part disposed over the panel part with a gap therebetween.

DETAILED DESCRIPTION

Hereinafter, descriptions will be made regarding a method of manufacturing an EL display device according to an embodiment of the present technology disclosed herein, with reference to FIGS. 1 to 5 of the accompanying drawings. It is noted, however, that descriptions in more detail than necessary will sometimes be omitted. For example, detailed descriptions of well-known items and duplicate descriptions of substantially the same configuration will sometimes be omitted, for the sake of brevity of the following descriptions and easy understanding by those skilled in the art.

Note that the accompanying drawings and the following descriptions are provided herein to facilitate fully understanding of the present disclosure by those skilled in the art, and are in no way intended to impose any limitation on the subject matter set forth in the appended claims.

Figure 1:
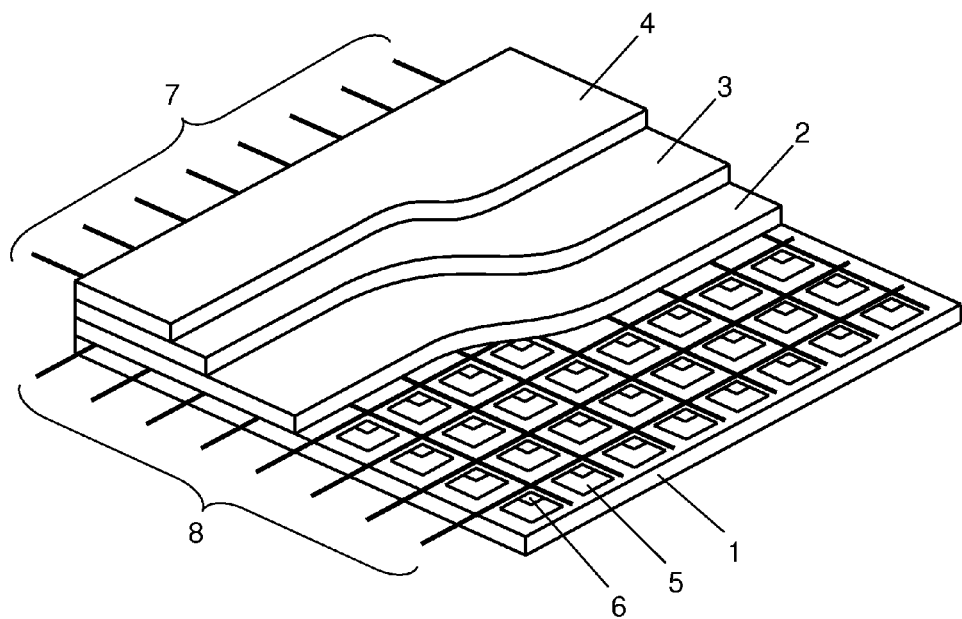
FIG. 1 is a schematic perspective view of a configuration of an organic EL display device according to an embodiment of the present technology disclosed herein.
Figure 2:
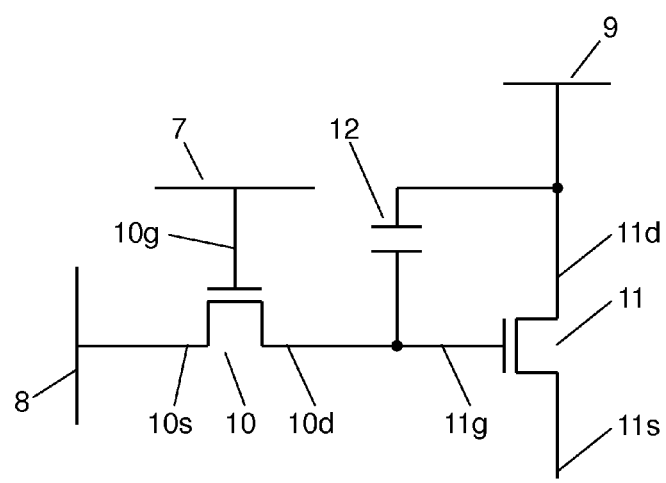
FIG. 2 is an electric circuit diagram of a circuit configuration of a pixel circuit that drives a pixel.

FIG. 1 is a schematic perspective view of a configuration of an organic EL display device according to the embodiment of the present technology disclosed herein. FIG. 2 is a view of a circuit configuration of a pixel circuit that drives a pixel.

As shown in FIGS. 1 and 2, the organic EL display device is configured having a laminated structure in which thin-film transistor array device 1 and light emitting part are laminated in this order from the lower layer. Thin-film transistor array device 1 includes a plurality of thin-film transistors. The light emitting part includes anode 2 serving as a lower electrode, light emitting layer 3 composed of an organic material, and cathode 4 serving as a transparent upper electrode. Light emission of the light emitting part is controlled by thin-film transistor array device 1. Moreover, the light emitting part has a configuration in which light emitting layer 3 is disposed between anode 2 and cathode 4 serving as a pair of electrodes. Between anode 2 and light emitting layer 3, a hole transport layer is formed by lamination. Between light emitting layer 3 and transparent cathode 4, an electron transport layer is formed by lamination. In thin-film transistor array device 1, a plurality of pixels 5 are disposed in a matrix.

Each of pixels 5 is driven by pixel circuit 6 that is disposed for the each. Moreover, thin-film transistor array device 1 includes a plurality of gate wirings 7 disposed in rows, a plurality of source wirings 8 serving as signal wirings disposed in columns to intersect with gate wirings 7, and a plurality of power supply wirings 9 (omitted in FIG. 1) extending in parallel with source wirings 8.

Gate wirings 7 connect, for every row, with gate electrodes 10g of thin-film transistors 10 which each operate as a switching element included in each of pixel circuits 6. Source wirings 8 connect, for every column, with source electrodes 10s of thin-film transistors 10 which each operate as a switching element included in each of pixel circuits 6. Power supply wirings 9 connect, for every column, with drain electrodes 11d of thin-film transistors 11 which each operate as a driving element included in each of pixel circuits 6.

As shown in FIG. 2, each of pixel circuits 6 is configured with thin-film transistor 10 operating as the switching element, thin-film transistor 11 operating as the driving element, and capacitor 12 storing data to be displayed at the corresponding pixels.

Thin-film transistor 10 is configured with gate electrode 10g connected to gate wiring 7, source electrode 10s connected to source wiring 8, drain electrode 10d connected to both capacitor 12 and gate electrode 11g of thin-film transistor 11, and a semiconductor film (not shown). Upon applying voltages to gate wiring 7 and source wiring 8 both connected to thin-film transistor 10, the transistor 10 stores, in capacitor 12, the value of the voltage applied to source wiring 8, with the value being as display data.

Thin-film transistor 11 is configured with gate electrode 11g connected to drain electrode 10d of thin-film transistor 10, drain electrode 11d connected to both power supply wiring 9 and capacitor 12, source electrode 11s connected to anode 2, and a semiconductor film (not shown). Thin-film transistor 11 supplies current corresponding to the voltage value stored in capacitor 12, to anode 2 from power supply wiring 9 via source electrode 11s. That is, the EL display device with the configuration described above employs an active matrix system in which display control is performed for every pixel 5 that is located at an intersection of gate wiring 7 and source wiring 8.

Moreover, in the EL display device, the light emitting parts that emit light of at least red, green, and blue lights are such that a plurality of sub-pixels is disposed in a matrix to form the plurality of the pixels. The sub-pixels have the respective light emitting layers to emit respective light of at least red light (R), green light (G), and blue light (B). The sub-pixels constituting each pixel are separated from each other by banks. The banks are formed in such a manner that protruded ribs extending in parallel with gate wirings 7 and protruded ribs extending in parallel with source wiring 8 are formed to intersect with each other. Then, in portions surrounded by the respective protruded ribs, i.e. in openings of the banks, the sub-pixels having the respective light emitting layers of R, G, and B are formed.

Figure 3:
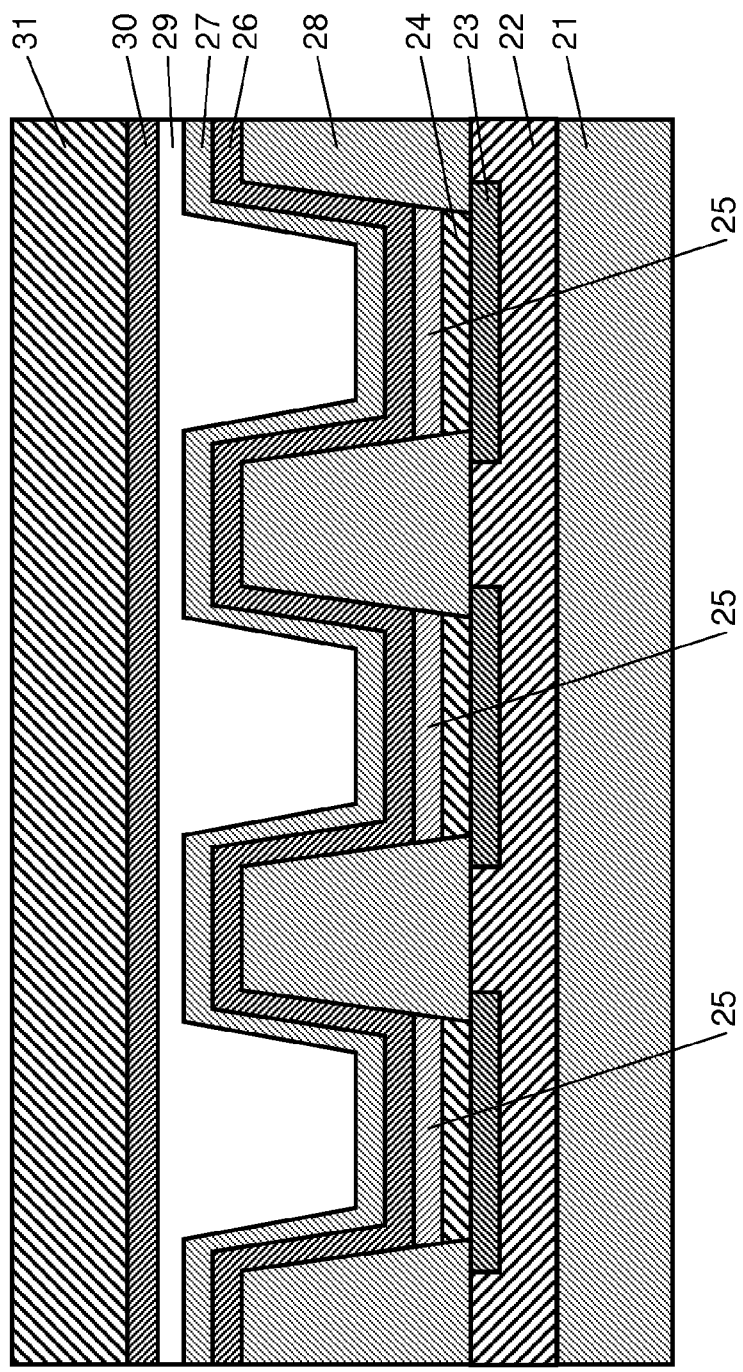
FIG. 3 is a cross-sectional view of a cross-sectional structure of sub-pixel portions of R, G, and B, in the EL display device.

FIG. 3 is a cross-sectional view of a cross-sectional structure of the sub-pixel portions of R, G, and B, in the EL display device. As shown in FIG. 3, the panel part of the EL display device is such that, on base substrate 21 such as a glass substrate or a flexible resin substrate, thin-film transistor array device 22 is formed which constitutes pixel circuits 6 described above. In addition, on thin-film transistor array device 22, anodes 23 serving as the lower electrodes are formed via a planarization insulating film (not shown). Then, on top of the anodes 23, there are laminated hole transport layer 24, light emitting layer 25 composed of the respective organic material to emit light of R, G, or B, electron transport layer 26, and cathode 27 serving as the transparent upper electrode, in this order. This constitutes the organic EL light-emitting parts of R, G, and B.

Moreover, each of light emitting layers 25 of the light emitting parts is formed in a region partitioned by banks 28 that are insulating layers. Banks 28 are intended to partition the light emitting region into predetermined shapes as well as to ensure the insulation between anodes 23 and cathodes 27. The banks are composed of a photosensitive resin including silicon oxide and polyimide, for example.

Note that, in the embodiment described above, only hole transport layers 24 and electron transport layers 26 are shown; however, in each of transport layers 24 and electron transport layers 26, a hole injection layer and an electron injection layer are formed by lamination, respectively.

The thus-configured light emitting parts are covered with sealing layer 29 made of such as silicon nitride. In addition, on top of sealing layer 29, sealing substrate 31 such as a transparent glass substrate or a transparent flexible resin substrate is bonded via bonding layer 30 over the entire sealing layer to seal the light emitting parts.

Here, for base substrate 21, its material may be appropriately selected depending on the application purpose, without particular restrictions in terms of shape, material, and size. For example, it may be a glass substrate such as a non-alkali glass or soda glass substrate, a silicon substrate, or a metal substrate. Moreover, being targeted at light weight and/or flexible performance, a polymeric material may be used for the substrate. For the polymeric material, there are suited polyethylene terephthalate, polycarbonate, polyethylenenaphthalate, polyamide, polyimide, and the like.

Other known polymeric materials for the substrate may be used including an acetate resin, an acryl resin, polyethylen, polypropylene, a polyvinylchloride resin, and the like. When the polymeric material is used for the substrate, the method of manufacturing the device is such that the polymeric material is formed by coating or bonding on a stiff substrate such as a glass one, followed by forming the organic EL light-emitting elements on the polymeric material. After that, the stiff substrate such as the glass one is removed.

Anodes 23 are configured using, such as, a metal material with high conductivity including aluminum, an aluminum alloy, and copper, or alternatively using a metal oxide or a metal sulfide which is optically transparent and highly electric-conductive, including IZO, ITO, tin oxide, indium oxide, and zinc oxide. The formation of the anodes may employ a method of forming thin films including vacuum vapor deposition, sputtering, and ion plating.

Hole transport layers 24 are configured using, such as, a polyvinyl carbazole material, a polysilane material, a polysiloxane derivative, a phthalocyanine compound including copper phthalocyanine, or an aromatic amine compound. The formation of the hole transport layers can employ various kinds of coating method. The hole transport layers are formed with a thickness of about 10 nm to 200 nm. Moreover, the hole injection layer laminated on hole transport layers 24 is one that enhances injection of holes from anode 23. The hole injection layer is formed by sputtering with a metal oxide such as molybdenum oxide, vanadium oxide, or aluminum oxide, or alternatively with a metal nitride or a metal oxynitride.

Light emitting layers 25 is configured mainly with an organic material which shows fluorescence and/or phosphorescence. When required, a dopant is added to the light emitting layers to improve characteristics of the layers. As a polymeric organic material suitable for printing, there are used a polyvinyl carbazole derivative, a poly-para-phenylene derivative, a polyfluorene derivative, a polyphenylene vinylene derivative, or the like. The dopant is used to shift wavelengths of emitted light and/or to improve light-emission efficiency. A wide range of the dopants, dye-based and metal complex-based ones, have been developed. Moreover, when light emitting layers 25 are formed on a large size substrate, printing methods are suitable for the formation thereof. Among various printing methods, an inkjet method is favorably used to form light emitting layers 25 with a thickness of about 20 nm to 200 nm.

Electron transport layers 26 are configured with a material including a benzoquinone derivative, a polyquinoline derivative, an oxadiazole derivative. The electron transport layers are formed through film formation by, such as, vacuum vapor deposition or coating application, to have a thickness of commonly about 10 nm to 200 nm. Moreover, the electron injection layers are formed, by vacuum vapor deposition or coating application, with a material including barium, phthalocyanine, and lithium fluoride.

Cathodes 27 are formed with a different material depending on the type of output direction of emitted light. For the type in which the emitted light is output from the cathode 27 side, the material is an optically-transparent and conductive material such as ITO, IZO, tin oxide, or zinc oxide. For the type in which the emitted light is output from the anode 23 side, the material is platinum, gold, silver, copper, tungsten, aluminum, an aluminum alloy, or the like. The cathodes are formed through film formation by, such as, sputtering or vacuum vapor deposition, to have a thickness of about 50 nm to 500 nm.

Banks 28 have a structure needed for filling each region with a sufficient amount of a solution containing the material of light emitting layers 25, and are formed in a predetermined shapes by photolithography. By controlling the shapes of banks 28, it is possible to define the shapes of the sub-pixels of the organic EL light-emitting part.

Sealing layer 29 is formed by forming a film of silicon nitride, and its film formation can employ a CVD (Chemical Vapor Deposition) method.

Figure 4:
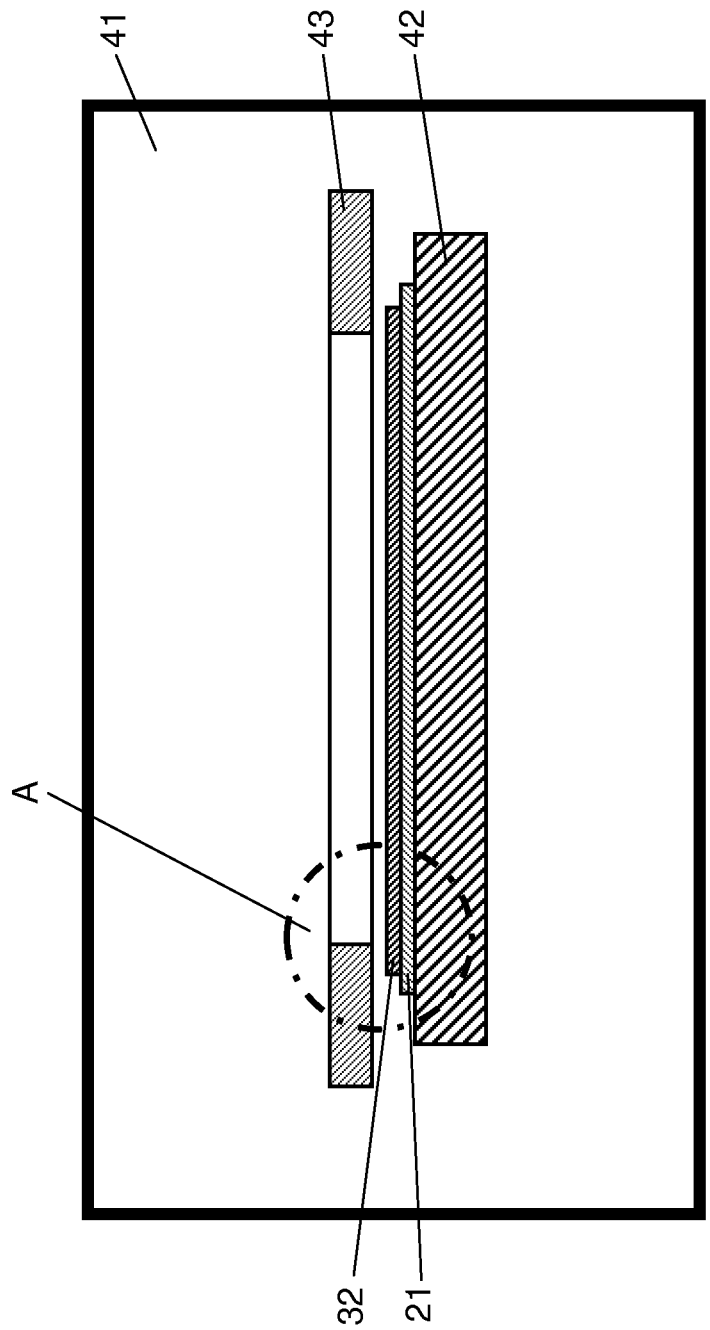
FIG. 4 is a schematic view of a configuration of plasma CVD equipment used for film formation of a sealing layer in a method of manufacturing the EL display device according to the embodiment of the present technology.

FIG. 4 is a schematic view of a configuration of plasma CVD equipment used for film formation of the sealing layer in the method of manufacturing the EL display device according to the embodiment of the present technology disclosed herein. As shown in FIG. 4, the CVD equipment is intended to form a film of silicon nitride, i.e. sealing layer 29, in such a manner that reaction gases are introduced into the inside of vacuum processing chamber 41 and then the film is formed on panel part 32 of base substrate 21 disposed on susceptor 42, through mask 43, by the CVD method. Panel part 32 disposed on base substrate 21 is configured with the light emitting part and the thin-film transistor array device. That is, the panel part includes the panel constituent elements that are formed up to cathodes 27, in the configuration shown in FIG. 3.

Moreover, although not shown in the figure, besides the configuration parts described above, the CVD equipment is further equipped with a mask supporting mechanism, a CCD camera, an alignment control unit, and the like. Alignment of mask 43 is performed in such a manner that an image of an overlapping portion between base substrate 21 and mask 43, with base substrate 21 and mask 43 being separated from each other, is taken with the CCD camera. Based on an result obtained from the control unit, a driving unit is actuated to align the mask 43.

Figure 5:
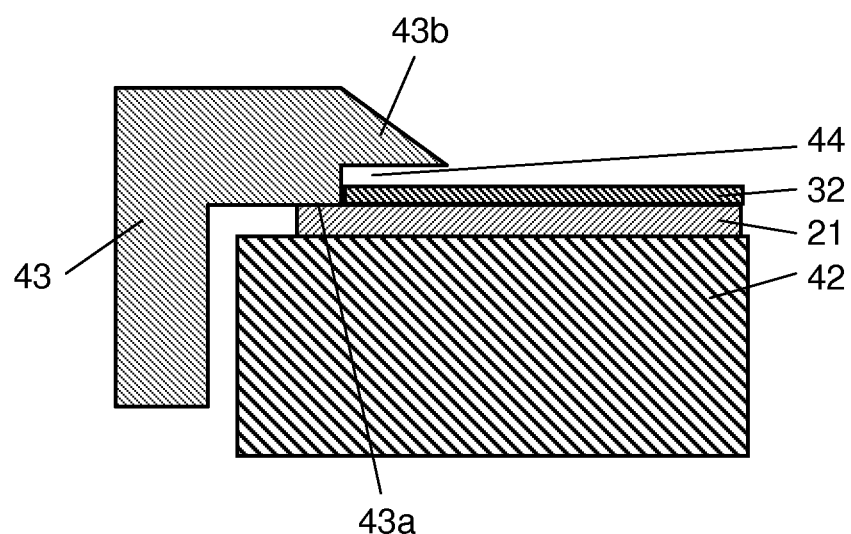
FIG. 5 is an enlarged view of portion A of FIG. 4.

FIG. 5 is an enlarged view of portion A of FIG. 4. Specifically, the figure is the schematic cross-sectional view showing a state of the mask being aligned with and disposed over the base substrate that is disposed on the susceptor, in the method of manufacturing the EL display device in accordance with the embodiment of the present technology disclosed herein.

As shown in FIG. 5, in the present technology, mask 43 includes contact part 43a that contacts with an edge portion of base substrate 21 disposed on susceptor 42, and edge part 43b that is disposed over panel part 32 with gap 44 therebetween. That is, mask 43 is configured to be disposed over base substrate 21 with the mask having gap 44 between the mask and panel part 32, during the film formation.

With this configuration, it is possible to prevent panel part 32 disposed on base substrate 21 from suffering from scratches that occur during the alignment of mask 43 and during the film formation with mask 43 that is disposed over the base substrate.

Note that, in the embodiments described above, although the descriptions have been made using the top-emission type device which has the structure easy to realize higher definition, the present technology disclosed herein is also effective for a bottom-emission type structure.

As described above, the aforementioned embodiments have been described for exemplifying the technology according to the present disclosure. However, the present technology disclosed herein is not limited to the embodiments, and may be applied to other embodiments which have been subjected to changes and modifications, replacements, additions, omissions, or the like.

As described above, the technology according to the present disclosure is effective for increasing yields in manufacturing the EL display devices.

What is claimed is:

1. A method of manufacturing an EL display device having a panel part, the panel part comprising:
   a light emitting part, in which a plurality of pixels are arrayed; and
   a thin-film transistor array device to control light emission of the light emitting part,
   the method comprising the successive steps of:
      forming the panel part on a substrate; and
      forming a sealing layer to cover the panel part,
   wherein the step of forming the sealing layer is performed by forming a film configuring the sealing layer with a mask being disposed over the substrate; and
   the mask includes:
      a contact part in contact with the substrate for covering an edge portion of the substrate; and
      an end part disposed over the panel part with a gap therebetween for covering an end part of the panel part, and for preventing the end part from contacting with the panel part.

2. The method of manufacturing the EL display device according to claim 1, wherein the step of forming the sealing layer is performed by a chemical vapor deposition (CVD) method.

* * * * *